United States Patent Office 3,669,667
Patented June 13, 1972

3,669,667
PREVENTING SPEED LOSS IN OXYGEN SENSITIVE PHOTO-RESIST LAYERS

Eugene R. Skarvinko, Binghamton, N.Y., assignor to International Business Machines Corporation, Armonk, N.Y.

No Drawing. Filed Dec. 21, 1970, Ser. No. 100,437
Int. Cl. G03c *1/46*
U.S. Cl. 96—68 4 Claims

ABSTRACT OF THE DISCLOSURE

A method for preventing loss of photographic speed of an oxygen sensitive photoresist by providing a layer of inert gas producing material over the standard photoresist. The gas producing material liberates gas during the exposure step thus protecting the resist.

BACKGROUND OF THE INVENTION

In a glass master manufacturing process a photo tracing machine and a precision contact printing machine are two major pieces of hardware that form the nucleus of the process. There are required both negative and positive photoresists for both the artwork generation and the contact printing operations. Shipley photoresist is a positive resist and Eastman Kodak KTFR is a negative resist which are preferred for such use. In order to be used successfully, oxygen sensitivity must be eliminated.

The problem of oxygen sensitivity of KTFR photoresist, for example, has been recognized for some time and is well documented in the prior art. Oxygen sensitivity is used to describe the fact that the photographic speed of KTFR is seriously reduced if oxygen is present during the time of the exposure. The magnitude of the speed loss depends to some extent on the thickness of the resist layer and is in the order of 60 times for a 0.6$\mu$ layer. Suggested solutions to the problem have been to use high vacuum frames or nitrogen flooding. The use of KTFR resists in pressure frames or in projection application is difficult and time consuming because of excessively long exposure duration. Nitrogen flooding during exposure requires additional equipment thus increasing cost. Also, nitrogen flooding cannot be used in pressure copying frames and is ineffective on projection printing.

Other proposed solutions include the use of topcoats such as polyisoprene. Many of these topcoats are effective in preventing the migration of oxygen to the KTFR layer during exposure; however, they have other limitations. For example, many polymers which prevent oxygen migration are soluble in solvents which also dissolve KTFR, therefore, such topcoats are difficult to apply without affecting the KTFR layer. In addition, if such topcoats could in some manner be applied, it would be difficult or impossible to remove them without destroying the KTFR layer because of the same considerations. And in another case, a polymer solution for providing a protective film for excluding oxygen from a resist layer was tried and using recommended methods, as well as other means, it was found impossible to remove completely the protective film which rendered it unsuitable for application in mask manufacturing. It was not possible to etch cleanly samples obtained which resulted in poor line definition. It appeared that this type of polymer would be satisfactory for mask protection in contact printing, due to the irregularities of the surface, but it would not be useful in oxygen protection during exposure.

SUMMARY OF THE INVENTION

The present invention makes it possible to overcome the above-mentioned difficulties by permitting the use of resins which are sufficiently different from KTFR in their solution characteristics. These resins are generally permeable to oxygen, however, and by themselves do not achieve the desired effect. However, the addition of a diazo to such a film forming carrier, regardless of the oxygen permeability of the carrier, will accomplish the desired end result without any of the described prior art limitations. The photoresist is preferably coated with a thin layer of a diazo salt dissolved in a water solution of a gelatin or resin. When exposed to actinic radiation, the diazo salt liberates nitrogen thus protecting the photoresist layer and increasing the photographic speed of the photoresist.

It is, then, the primary object of the present invention to provide a novel and economical method for increasing the photographic speed of an oxygen sensitive photoresist by providing a layer of inert gas producing material over the resist, which material liberates gas during the exposure step to protect the resist.

A further object of the present invention is to provide a novel and economical method for increasing the photographic speed of an oxygen sensitive photoresist by coating the resist with a thin layer of diazo salt dissolved in a water solution of a gelatin or resin, which salt liberates nitrogen during the exposure step to protect the resist.

A still further object of the present invention is to provide protection for an oxygen sensitive photoresist by novel means having a photochemical reaction which is independent of external effects.

The foregoing and other objects, features and advantages of the invention will be apparent from the following more particular description of preferred embodiments of the invention.

DESCRIPTION OF PREFERRED EMBODIMENTS

In practicing the invention, there was prepared a 2 x 2 inch chrome coated glass sample by applying a coat of KTFR photoresist and coating it with a thin layer, in the order of 0.6$\mu$ to 1.0$\mu$, of a diazo salt dissolved in a water solution of gelatin. Exposure of the sample to actinic radiation caused the diazo salt to liberate nitrogen which protected the photoresist layer from oxygen.

Two samples, one with and one without the protective coating, were exposed through a photographic step tablet with a 500 watt Osram high pressure mercury lamp in a pressure frame. The regular sample which did not have the protective layer required about 60 times longer exposure than the one with it.

The following examples illustrate the materials and methods of the invention. It will be understood that the invention is not limited to the examples nor to the components, proportions, conditions and procedures set forth therein.

EXAMPLE 1

A protective solution for producing nitrogen gas during an exposure step has the following composition:

| | | |
|---|---|---|
| p-Diazodimethylaniline zinc chloride | g | 1.0 |
| Gelatin (P1099 Eastman organic chemicals) | g | 2.0 |
| Methyl alcohol | ml | 10 |
| Photo-Flo® (Eastman Kodak wetting agent) | ml | 1 |
| Distilled water | ml | 100 |

The protective solution is coated over the photoresist by using a whirler rotating at a speed of 2500 to 4000 r.p.m. for 30 seconds. After drying at 180° F. for 15 minutes and cooling to room temperature, the plate is exposed and nitrogen gas released.

After exposure, the protective coating is removed by immersion in approximately a 2% solution of sodium hypochlorite (bleach) for 30 seconds followed by rinsing with distilled water for 15 to 30 seconds. After drying, the plate having the photoresist layer only is processed in the conventional manner.

EXAMPLE 2

An alternative protective solution for producing nitrogen gas during an exposure step has the following composition:

| | | |
|---|---|---|
| p-Diazodimethylaniline zinc chloride | g | 2.0 |
| AN119 Gantrez® (GAF water soluble resin) | g | 2.0 |
| Photo-Flo® (Eastman Kodak wetting agent) | ml | 1 |
| Distilled water | ml | 100 |

As in Example 1, the protective solution is coated over the photoresist by using a whirler rotating at a speed of 2500 to 4000 r.p.m. for 30 seconds. After drying at 180° F. for 15 minutes and cooling to room temperature, the plate is exposured and nitrogen gas released.

After exposure, the protective coating is removable with either cold or hot water, with hot water in the order of 100° F. speeding up the removal. After drying, the plate having the photoresist layer only is processed in the conventional manner.

The fundamental principle of the invention is the liberation of molecular nitrogen during exposure, as illustrated below:

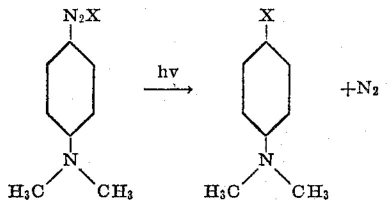

The diazo composition upon being exposed to actinic radiation will leave the decomposition products, one of which is free nitrogen used for the purpose of protection. Any suitable compound capable of releasing inert gas by exposure to actinic radiation can be used.

Protection by a film layer alone will present problems because of the influence of several factors on permeability, such as thickness, humidity, temperature, and pressure. The diazo containing layer is independent of the above. For example, tests were made using the gelatin solution alone and gelatin with diazo. The results showed that the protection was about equal for a given thickness. However, when the concentration of the gelatin was reduced, resulting in thinner coatings, the layer with gelatin only showed a sharp drop in protection. The oxygen protection was retained with the diazo containing layer. The distinction between the two methods is that the diazo method provides a unique and novel means for protection by a photochemical reaction which is independent of the external effects.

A photosensitive element prepared according to the present invention can be used conveniently in pressure frames where nitrogen flooding would not be possible and also in artwork generators. Another advantage is more effective protection since the nitrogen generated during exposure is in intimate contact with the photoresist. At the same time, the top layer will serve as an abrasion protection. Still another advantage is the easy and inexpensive method of preparation and elimination of additional equipment used in the nitrogen flooding method.

While the invention has been particularly shown and described with reference to preferred embodiments thereof, it will be understood by those skilled in the art that various changes in form and details may be made therein without departing from the spirit and scope of the invention.

What is claimed is:

1. A method for preventing loss of photographic speed by an oxygen sensitive photoresist layer which comprises:

applying to the photoresist layer a thin protective coating comprising a compound which decomposes upon exposure to actinic radiation and thereby liberates molecular nitrogen, exposing the photoresist layer through said coating to actinic radiation whereby nitrogen is liberated in the exposed areas of said coating to protect the resist from oxygen.

2. The method of claim 1 wherein said coating consists of a diazo salt dissolved in a water solution of a film forming resin or gelatin.

3. The method of claim 2 wherein said coating consists of a solution of p-diazodimethylaniline zinc chloride in gelatin.

4. The method of claim 2 wherein said coating consists of a solution of p-diazodimethylaniline zinc chloride in a film forming resin.

References Cited

UNITED STATES PATENTS

| | | | |
|---|---|---|---|
| 3,591,378 | 7/1971 | Altman | 96—91 N |
| 2,950,194 | 8/1960 | Glavin | 96—75 |
| 2,695,846 | 11/1954 | Mally | 96—91 N |

FOREIGN PATENTS

| | | | |
|---|---|---|---|
| 14,886 | 1963 | Japan | 96—35.1 |

OTHER REFERENCES

Landau et al., J. Phot. Sci., vol. 13, 1965, pp. 150–151.

NORMAN G. TORCHIN, Primary Examiner

J. WINKELMAN, Assistant Examiner

U.S. Cl. X.R.

96—35.1, 36.2, 75, 91(N); 117—6, 34